(12) United States Patent
Wang et al.

(10) Patent No.: US 6,359,307 B1
(45) Date of Patent: Mar. 19, 2002

(54) METHOD FOR FORMING SELF-ALIGNED CONTACTS AND INTERCONNECTION LINES USING DUAL DAMASCENE TECHNIQUES

(75) Inventors: Fei Wang, San Jose; Hiroyuki Kinoshita, Sunnyvale; Kashmir Sahota, Fremont; Yu Sun, Saratoga; Wenge Yang, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/493,436

(22) Filed: Jan. 29, 2000

(51) Int. Cl.[7] .............................................. H01L 29/76
(52) U.S. Cl. ...................................... 257/332; 438/339
(58) Field of Search ................... 365/185.01; 438/264, 438/257, 587, 229, 339; 257/332, 900, 340

(56) References Cited

U.S. PATENT DOCUMENTS 5,553,018 A * 9/1996 Wang et al. ............ 365/185.01
5,776,811 A * 7/1998 Wang et al. ................ 438/264
6,136,649 A * 10/2000 Hui et al. .................... 438/257
6,242,332 B1 * 6/2001 Cho et al. .................... 438/587

* cited by examiner

Primary Examiner—David Nelms
Assistant Examiner—Bau T Le
(74) Attorney, Agent, or Firm—Mikio Ishimaru (57) ABSTRACT

The present invention further provides a method for forming self-aligned contacts using a dual damascene techniques that reduces the number of process steps and results in a reduction in cycle time, cost and yield loss. In a preferred embodiment, a method for forming a contact and a channel in a dielectric layer over a region on a semiconductor substrate is provided. The contact is self-aligned. The contact and channel are formed by (1) forming a contact opening in the dielectric layer, (2) forming a channel opening in the dielectric layer, wherein the channel opening encompasses the contact opening, (3) extending the contact opening to expose a portion of the region on the semiconductor substrate; and (4) filling the contact opening and the channel opening with a conductive material to form a contact and a channel, respectively.

5 Claims, 11 Drawing Sheets

METHOD FOR FORMING SELF-ALIGNED CONTACTS AND INTERCONNECTION LINES USING DUAL DAMASCENE TECHNIQUES

TECHNICAL FIELD

The present invention relates generally to semiconductors and more specifically to an improved fabrication process for making semiconductor memory devices.

BACKGROUND ART

In general, memory devices such as a Flash electrically erasable programmable read only memory (EEPROM) are known. EEPROMs are a class of nonvolatile memory devices that are programmed by hot electron injection and erased by Fowler-Nordheim tunneling.

Each memory cell is formed on a semiconductor substrate (i.e., a silicon die or chip), having a heavily doped drain region and a source region embedded therein. The source region further contains a lightly doped deeply diffused region and a more heavily doped, shallow diffused region embedded into the substrate. A channel region separates the drain region and the source region. The memory cell further includes a multi-layer structure, commonly referred to as a "stacked gate" structure or word line. The stacked gate structures typically include: a thin gate dielectric or tunnel oxide layer formed on the surface of a substrate overlying the channel region; a polysilicon floating gate overlying the tunnel oxide; an interpoly dielectric overlying the floating gate; and a polysilicon control gate overlying the interpoly dielectric layer. Additional layers, such as a silicide layer (disposed on the control gate), a poly cap layer (disposed on the silicide layer), and a silicon oxynitride layer (disposed on the poly cap layer) may be formed over the control gate. A plurality of Flash EEPROM cells may be formed on a single substrate.

The process of forming Flash EEPROM cells is well known and widely practiced throughout the semiconductor industry. After the formation of the memory cells, electrical connections, commonly known as "contacts", must be made to connect the stack gated structure, the source region and the drain regions to other parts of the chip. The contact process starts with the formation of sidewall spacers around the stacked gate structures of each memory cell. An etch stop layer, typically a silicon nitride material, is then formed over the entire substrate, including the stacked gate structures, using conventional techniques, such as chemical vapor deposition (CVD). A dielectric layer, generally of oxide, is then deposited over the etch stop layer, and a layer of photoresist is placed over the dielectric layer and photo-lithographically processed to form the pattern of contact openings. An anisotropic oxide etch is then used to etch out portions of the dielectric layer to form source and drain contact openings in the dielectric layer. The contact openings stop at the etch stop layer. A further etch is then used to remove the etch stop layer so that the source and drain contact openings reach the source and drain region, respectively. The photoresist is then stripped. A conductive material, such as tungsten, is then deposited over the dielectric layer filling the source and drain contact openings. The substrate is then subjected to a chemical-mechanical polishing (CMP) process which removes the conductive material above the dielectric layer to form so-called "self-aligned contacts". A layer of conductive material, such as tungsten, is then deposited over the dielectric layer and the contacts. The conductive layer is patterned to form interconnection lines to selectively connect to the contacts. The spacing between the interconnection lines are then filled with a dielectric material. The dielectric material above the interconnection lines is then planarized using for example, chemical-mechanical polishing (CMP) techniques.

One of the problems associated with the conventional self-aligned contact process is that it requires two separate metallization steps: one to fill the contact openings to form the contacts and the other to form the interconnection lines above the contacts. The other problem associated with the conventional self-aligned contact process is that it requires two planarization steps: one to planarize the dielectric layer to form the contacts, and the other to planarize the dielectric layer formed above the interconnection lines. Each additional metallization or planarization step adversely increases cycle time and process complexity and also introduces particles and defects, resulting in an increase in cost and yield loss.

A solution, which would reduce the number of process steps in forming self-aligned contacts and maintain the device performance has long been sought, but has eluded those skilled in the art.

DISCLOSURE OF THE INVENTION

The present invention provides an improved method for making semiconductor devices.

The present invention provides an improved method for making semiconductor devices that results in a reduction in cycle time, cost and yield loss.

The present invention further provides a method for forming self-aligned contacts using a dual damascene technique that results in a reduction in the number of process steps.

The present invention provides a method for forming self-aligned contacts which eliminates one metallization step and one planarization step by forming the contacts and the channels at the same time.

The present invention still further provides a method for forming a contact and a channel in a dielectric layer over a region on a semiconductor substrate. The contact is self-aligned. The contact and channel are formed by (1) forming a contact opening in the dielectric layer to expose a portion of the region on the semiconductor substrate, (2) forming a channel opening in the dielectric layer, wherein the channel opening encompasses the contact opening, and (3) filling the contact opening and the channel opening with a conductive material to form a contact and a channel, respectively.

The above and additional advantages of the present invention will become apparent to those skilled in the art from a reading of the following detailed description when taken in conjunction with the accompanying drawings.

BRIEF DESCRIPTION OF THE DRAWINGS

FIG. 4A through 4G illustrate the sequence of process steps of a process in accordance with the present invention for forming self-aligned contacts using a dual damascene technique in a portion of a cell array core.

BEST MODE FOR CARRYING OUT THE INVENTION

Figure 1:
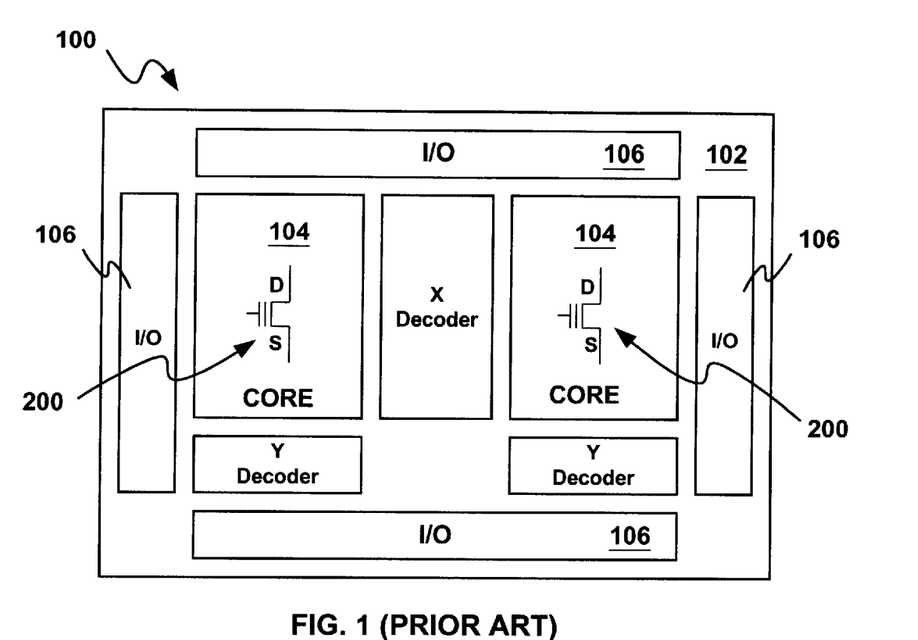
FIG. 1 (PRIOR ART) is a plan view of a conventional memory device.

Referring now to FIG. 1 (PRIOR ART), therein is shown a plan view of a conventional memory device, a Flash EEPROM 100 which commonly includes a semiconductor substrate 102 in which one or more high-density core regions and one or more low-density peripheral portions are formed. High-density core regions typically include one or more M×N array cores 104 of individually addressable, substantially identical memory cells 200. Low-density peripheral portions 106 typically include input/output (I/O) circuitry and circuitry for selectively addressing the individual cells. The selective addressing circuitry typically includes one or more x-decoders and y-decoders, cooperating with the I/O circuitry for connecting the source, gate, and drain of selected addressed cells to predetermined voltages or impedances to effect designated operations on the cell, e.g., programming, reading and erasing, and deriving necessary voltages to effect such operations.

Figure 2A:
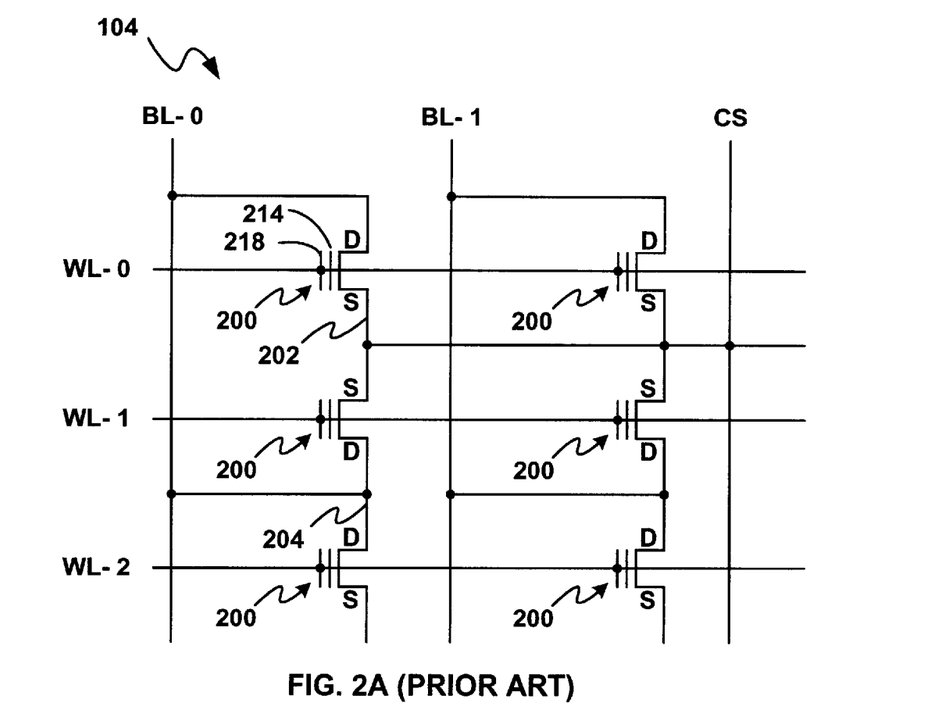
FIG. 2A (PRIOR ART) is schematic diagram of a portion of a memory cell array.
Figure 2B:
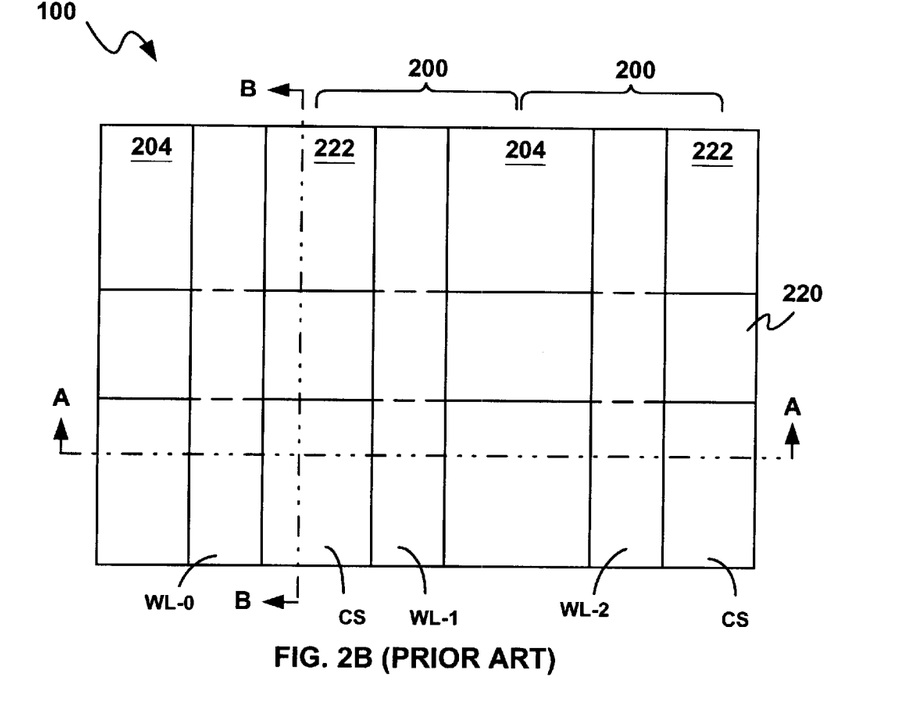
FIG. 2B (PRIOR ART) is a plan view of a portion of an intermediate state (partially complete) of a cell array core.
Figure 2C:
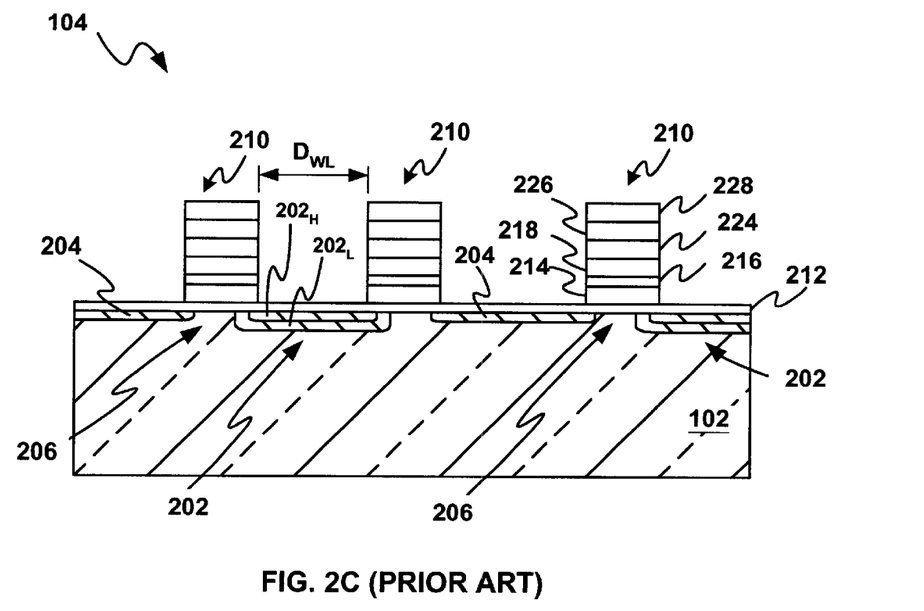
FIG. 2C (PRIOR ART) is a simplified cross section of FIG. 2B (PRIOR ART) along line A—A.

Referring now to FIG. 2A (PRIOR ART), therein is shown a schematic diagram of a portion of a memory cell array in which each cell in array core 104 typically comprises a source 202, a drain 204, and a channel 206 (shown in FIG. 2C (PRIOR ART)).

Referring now to FIG. 2B (PRIOR ART), therein is shown a plan view of a portion of an intermediate state (partially complete) of a cell array core 104.

Referring now to FIG. 2C (PRIOR ART), therein is shown a simplified cross section of FIG. 2B (PRIOR ART) along line A—A. The source 202, drain 204, and channel 206 semiconductor regions are shown formed in semiconductor substrate 102 (or in an isolation well); and a multi-layer structure, commonly referred to as a "stacked gate" (word line) structure 210. The stacked gate structures 210 include: thin gate dielectric layer 212 (commonly referred to as the "tunnel oxide") formed on the surface of substrate 102 overlying channel 206; a floating gate 214 overlying the gate dielectric layer 212; an interpoly (inter-gate) dielectric 216 overlying the floating gate 214; and a control gate 218 overlying the interpoly dielectric 216. Additional layers, such as a silicide layer 224 (disposed on the control gate 218), a poly cap layer 226 (disposed on the silicide layer 224), and a silicon oxynitride layer 228 (disposed on the poly cap layer 226) may be formed over the control gate 218. The cells 200 are arranged in a series of rows and columns.

In the completed array, the control gates 218 of the cells 200 in a row are formed integral to a common word line (WL) associated with the row. Columns of cells are arranged such that adjacent cells in a column share a common semiconductor region as a source or drain region. The source 202 of each cell in a column (except end cells) is formed in a common region with one of the adjacent cells, e.g., the preceding cell in the column. Likewise, the drain of the cell is formed in a common region with the drain 204 of the other adjacent cell, e.g., the next succeeding cell in the column (except end cells). The drain 204 of each cell in a column of cells is connected by a conductive bit line (BL) (FIG. 2A (PRIOR ART)), including an overlying layer of metal connected to each drain 204 of the cells 200 within the column. Additionally, the sources 202 of each cell 200 in a row (and hence pairs of rows) are interconnected by a common source line CS (FIG. 2A (PRIOR ART)) formed in the substrate 102, as will be described. Any particular cell 200 within the array cores 104 can be individually addressed (programmed and read) by operating upon one word line and one bit line.

Typically, in forming an EEPROM 100, a pattern of field oxide regions 220 (FIG. 2B (PRIOR ART)) is initially formed to provide electrical isolation between the respective devices of EEPROM 100. For example, field oxide regions 220 are used to provide isolation between the array cores 104 and the devices of peripheral portions 106, as well as between the various columns of cells 200 within the array cores 104. Field oxide regions 220 are conventionally formed using a mask and selective growth process: a layer of thermal oxide ("barrier oxide" or "pad oxide") is grown or deposited over the surface of the substrate 102; a mask, frequently composed of nitride, is deposited on the barrier oxide, and patterned to cover those regions of the substrate 102 in which devices are to be formed (herein referred to as active regions); field oxide is grown in the exposed areas of the barrier oxide, by for example, the local oxidation of silicon (LOCOS); and the masking layer and barrier oxide are stripped to expose the underlying substrate 102. In general, referring to FIG. 2B (PRIOR ART), within the array cores 104, the selective growth process results in alternating parallel strips of field oxide regions 220 and exposed regions corresponding to the columns of cells 200 in the array.

The stacked gate (word line) structures 210 are then typically formed. For example, gate dielectric layer 212, comprising a thin (e.g. approximately 100 angstroms) layer of oxide, is initially formed on the substrate 102 by a technique, such as thermal oxidation of the surface of the substrate 102 or by depositing a suitable material on the substrate 102. A layer of conductive polysilicon (e.g., polycrystalline silicon), that will ultimately form the floating gates 214, is typically then formed on gate dielectric layer 212. For example, conductive polysilicon may be deposited by a number of different techniques, e.g., conventional chemical vapor deposition (CVD). The polysilicon layer is typically then masked and etched to remove strips overlying the field oxide regions 220, leaving isolated strips of polysilicon on top of the gate dielectric layer 212 overlying the substrate regions corresponding to the columns of cells 200 of the array core 104 (i.e. the regions in which source, channel, and drain regions of cells in the column will be formed). A layer of dielectric material, such as, e.g., an oxide-nitride-oxide (ONO) layer, that will ultimately form interpoly dielectric 216 is typically then formed. For example, where the interpoly dielectric 216 is ONO, it is formed by growing a layer of oxide, depositing a layer of nitride, followed by growing another layer of oxide. The interpoly dielectric 216, in the completed array, insulates control gates 218 from floating gates 214 in the individual cells and electrically isolates the adjacent columns of the floating gates 214 in the array core 104. Another layer of conductive polysilicon (e.g., polycrystalline silicon), that will ultimately form the control gates 218 and the word lines WL connecting the control gates 218 of the cells in the respective rows of the array core 104, referred to as the control gate 218, is typically then deposited on the interpoly dielectric 216 by a technique such as conventional CVD. Portions of the control gate 218 and the interpoly dielectric 216 are typically then selectively removed to define the stacked gate structures 210 on the gate dielectric layer 212, i.e., to form the floating gates 214, the interpoly dielectric 216, control gates 218 of the individual cells, and the word lines WL (portions of the interpoly dielectric 216, the control gate 218, and the field oxide regions 220 connect the respective cells 200 of the rows of the array cores 104). This is typically effected by masking and etching techniques.

When completed, this etch creates the generally parallel, stacked gate (word line) structures 210 separated by a distance $D_{WL}$, as shown in FIG. 2C (PRIOR ART). A silicide layer 224 is typically provided over the control gate 218 to reduce resistance. Thereafter, a polysilicon layer (commonly referred to as a "poly cap" layer) 226 is formed over the silicide layer 224 to serve as a cap layer for the stacked gate structures 210. Next, a silicon oxynitride layer 228 may be formed over the poly cap layer 226. The combination of the poly cap layer 226 and the silicon oxynitride layer 228 is commonly referred to as a "passivation layer". Thereafter, portions of the poly cap layer 226 and the silicon oxynitride layer 228 are selectively removed using conventional masking and etching techniques to define the final stacked gate structures 210.

Conventionally, the portions of the field oxide regions 220 and the gate dielectric layer 212 between every second pair of adjacent stacked gate (word line) structures 210 in the array core 104 (i.e., the regions, generally indicated as 222, where the sources 202 are to be formed and the portions of the field oxide regions 220 are disposed between sources 202 of the corresponding cells of adjacent columns) are then typically removed, in preparation for formation of the common line CS (not shown) connecting the sources 202. This is typically effected using a conventional Self-Aligned Source (SAS) etch.

Figure 2D:
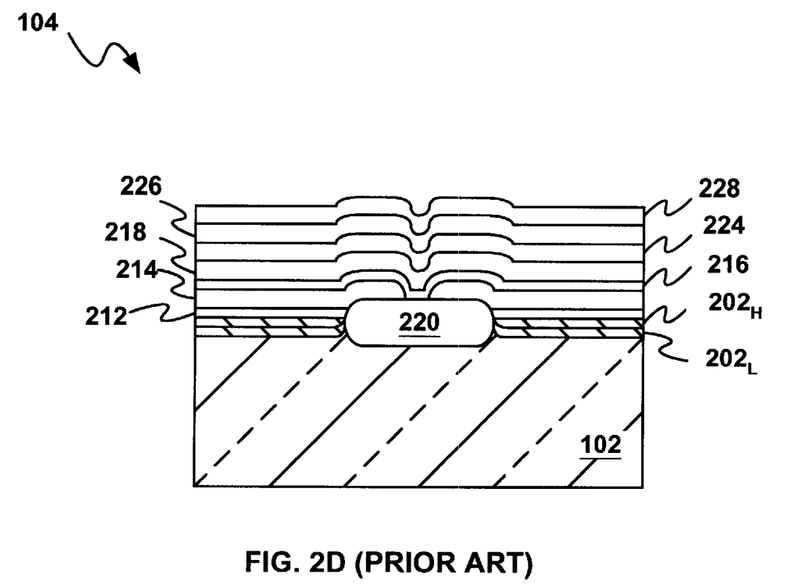
FIG. 2D (PRIOR ART) is a simplified cross section of FIG. 2B (PRIOR ART) along line B—B.

Referring now to FIG. 2D (PRIOR ART), therein are shown the source 202, common line CS, and drain 204 regions formed in a conventional process. The source 202 and the common source line CS are typically formed by initially effecting a conventional double diffusion implant (DDI), with the SAS mask still in place. The DDI implants a first dopant (e.g. n-type, such as phosphorous) to form a deeply diffused but lightly doped N well $202_L$ establishing a graded source-channel junction as shown in FIG. 2D (PRIOR ART) which is a simplified cross section of FIG. 2B (PRIOR ART) along line B—B. The SAS mask is then removed. The DDI implant is typically driven deeper into the substrate 102, by subjecting the substrate 102 to a thermal cycle at a high temperature (e.g. 1050 degrees Celsius). A shallow second implant, commonly referred to as a medium diffused drain (MDD) implant, is then performed (e.g., with arsenic) to create a more heavily doped, but shallower, n+ well $202_H$ embedded within deep N well $202_L$. The MDD implant also forms a shallow, abrupt drain 204.

Figure 3A:
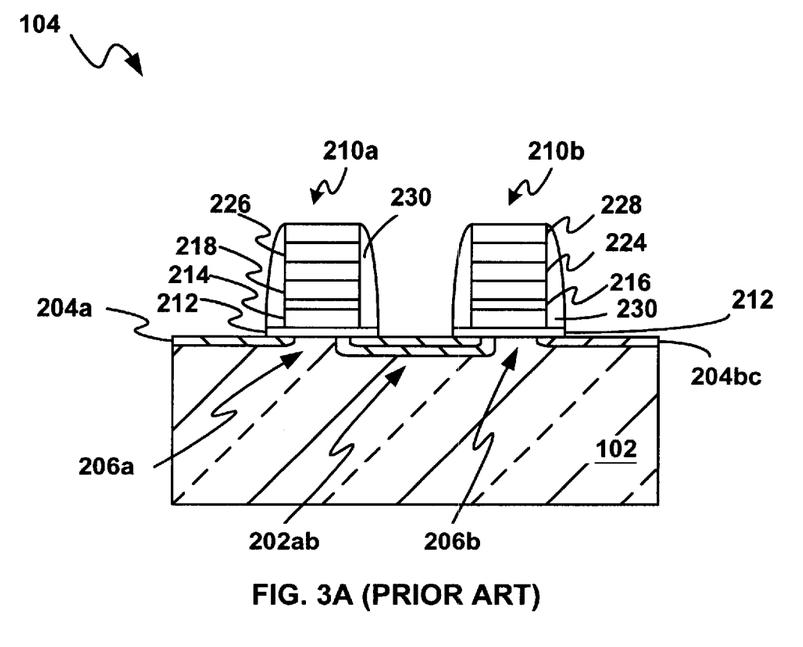
FIG. 3A (PRIOR ART) through 3J (PRIOR ART) illustrate the sequence of process steps of a conventional process for forming self-aligned contacts in a portion of a cell array core.

Referring now to FIGS. 3A (PRIOR ART) through 3J (PRIOR ART), therein is shown the sequence of process steps of a conventional process for forming source/drain (S/D) contacts and associated interconnection lines.

FIG. 3A (PRIOR ART) shows the formation of sidewall spacers 230 around stacked gate structures 210a and 210b formed on semiconductor substrate 102. The sidewall spacers 230 may be formed of a nitride material using conventional deposition and etching techniques. At this stage are shown a channel region 206a separated by a drain 204a and a common source 202ab, and a channel region 206b separated by the common source 202ab and a common drain 202bc. Except for the gate dielectric layer 212 that is located directly underneath the stack gates 210a and 210b and sidewall spacers 230, the gate dielectric layer 212 in other areas of the substrate 102 is removed using conventional etch techniques.

Figure 3B:
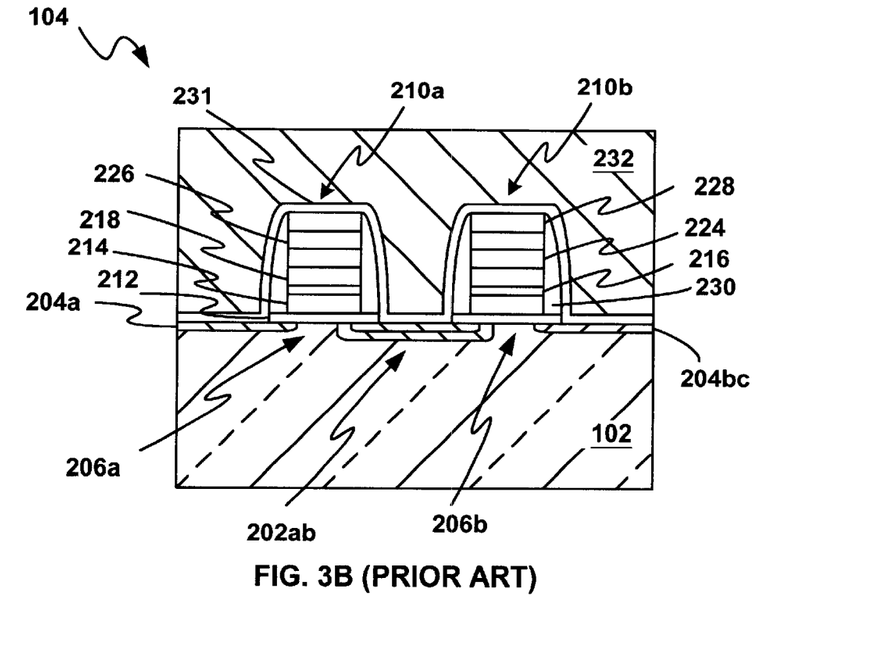

FIG. 3B (PRIOR ART) shows the deposition of an etch stop layer 231 over the entire substrate 102, including over the stacked gate structures 210a and 210b using conventional techniques, such as chemical vapor deposition (CVD). The etch stop layer 231 is typically formed of a material such as silicon nitride and is formed to a thickness typically in the range of approximately 30 to 120 nm. The deposition of the etch stop layer 231 is followed by the deposition of a dielectric layer 232 over the etch stop layer 231. The dielectric layer 232 may include boro-phospho-tetra-ethyl-ortho silicate (BPTEOS) formed using plasma enhanced chemical vapor deposition (PECVD). The etch stop layer 231 is used as an etch stop layer for the subsequent formation of contact openings in the dielectric layer 232.

Figure 3C:
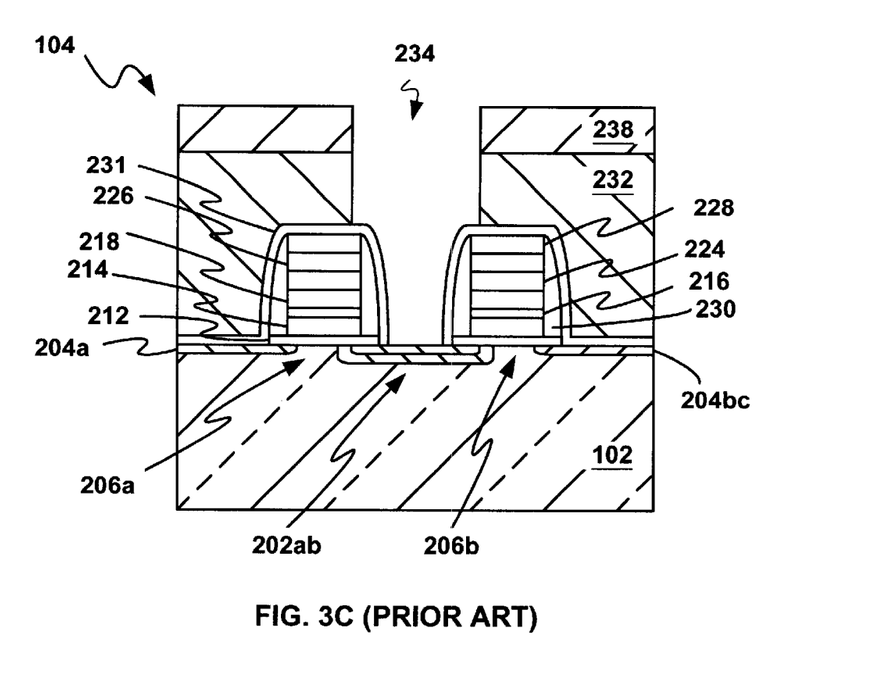

FIG. 3C (PRIOR ART) shows the formation of source/drain (S/D) contact opening 234 through etch stop layer 231, using a contact mask 238 to expose portions of the common source 202ab. For simplicity of illustration, only one contact opening 234 is shown. Contact opening 234 is formed conventionally using a two-step etch process. The first etch process is a conventional dielectric etch process which stops at the etch stop layer 231. The second etch process is a conventional etch process which removes portions of the etch stop layer 231 to expose portions of the common source 202ab. Portions of the etch stop layer 231 around the sidewall spacers 230 are also removed during this second etch process.

Figure 3D:
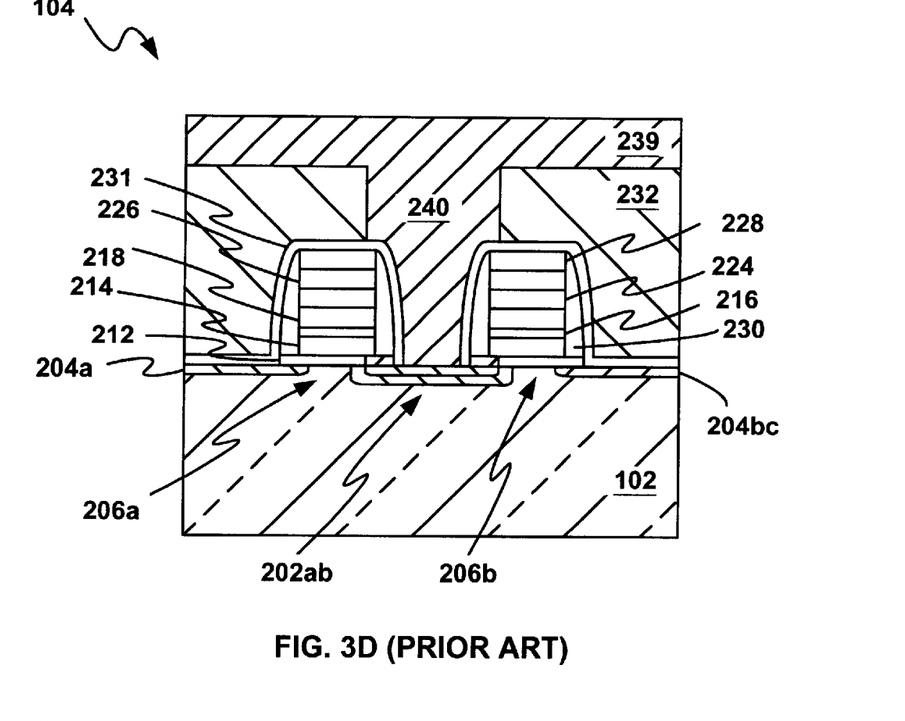

FIG. 3D (PRIOR ART) shows the removal of the contact mask 238 and deposition of a conductive material to form a first conductive layer 239 over the dielectric layer 232. The conductive material fills the contact opening 234 which will form a contact 240. The conductive material typically includes tungsten and may be formed using conventional metal deposition techniques, such as CVD and/or physical vapor deposition (PVD). A barrier material (not shown), such as titanium (Ti)/titanium nitride (TiN), is typically deposited to coat the walls of the contact opening 234 prior to the deposition of the conductive material to ensure good adhesion and electrical contact to the walls of the contact opening 234 and the underlying common source 202ab.

Figure 3E:
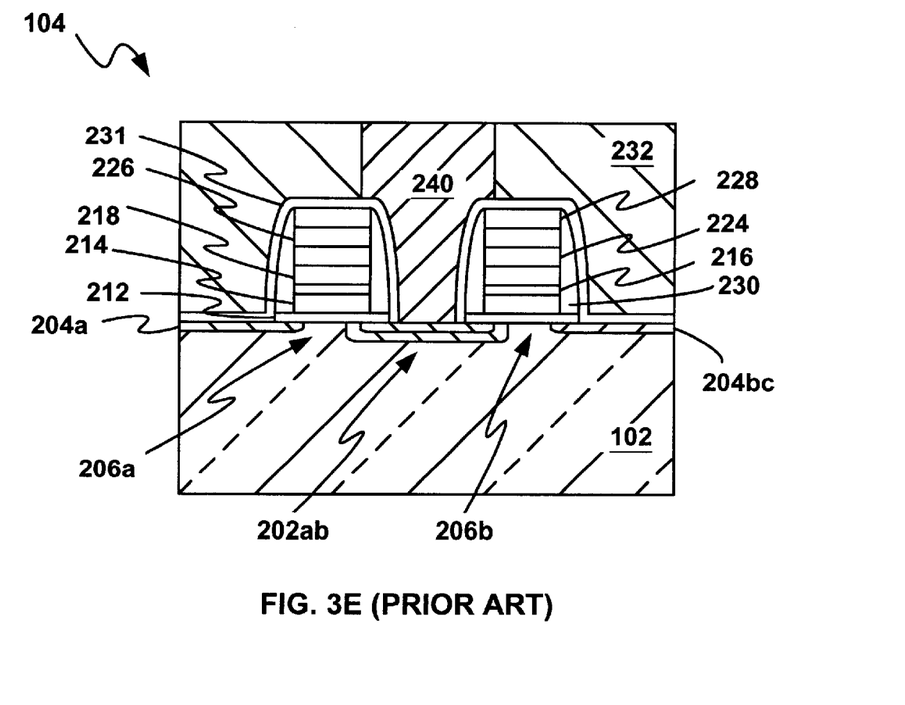

FIG. 3E (PRIOR ART) shows the removal of the conductive material above the dielectric layer 232 using conventional planarization techniques, such as chemical-mechanical polishing (CMP).

Figure 3F:
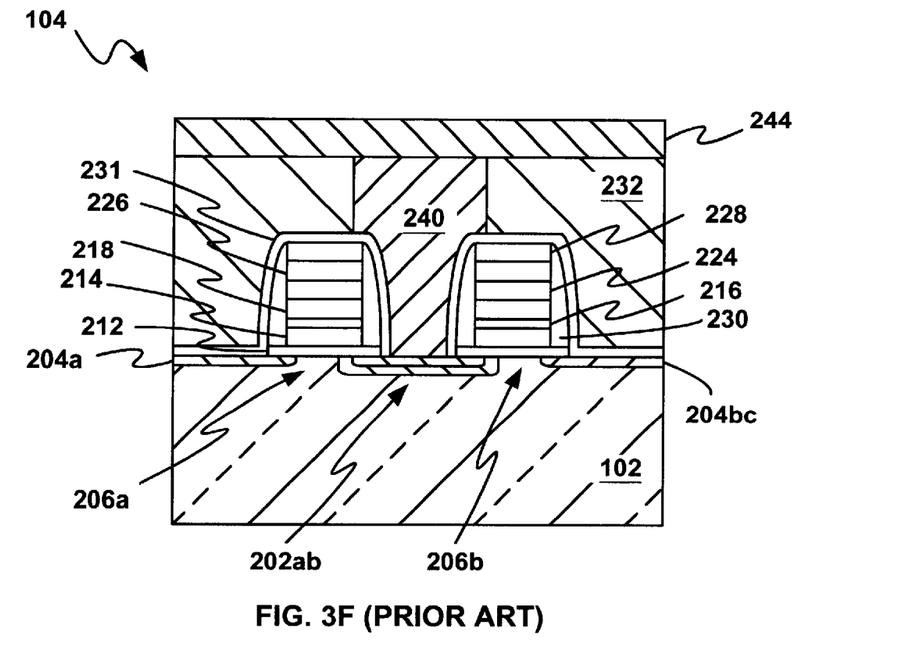

FIG. 3F (PRIOR ART) shows the deposition of a second conductive layer 244 over the dielectric layer 232. The second conductive layer 244 may include a metal, such as tungsten.

Figure 3G:
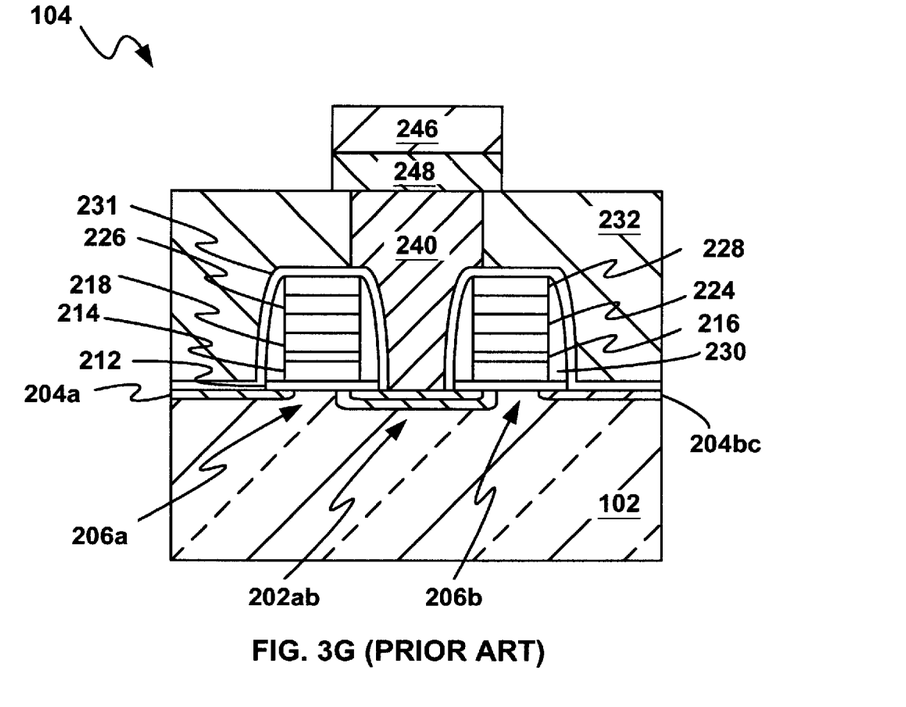

FIG. 3G (PRIOR ART) shows the formation of an interconnect mask 246 over the second conductive layer 244, followed by patterning of the second conductive layer 244 to form an interconnection line 248 above the dielectric layer 232. The interconnection line 248 is in physical and electrical contact with the contact 240. The interconnect mask 246 is typically formed by depositing a layer of photoresist material over the second conductive layer 244, followed by conventional patterning and etching processes.

Figure 3H:
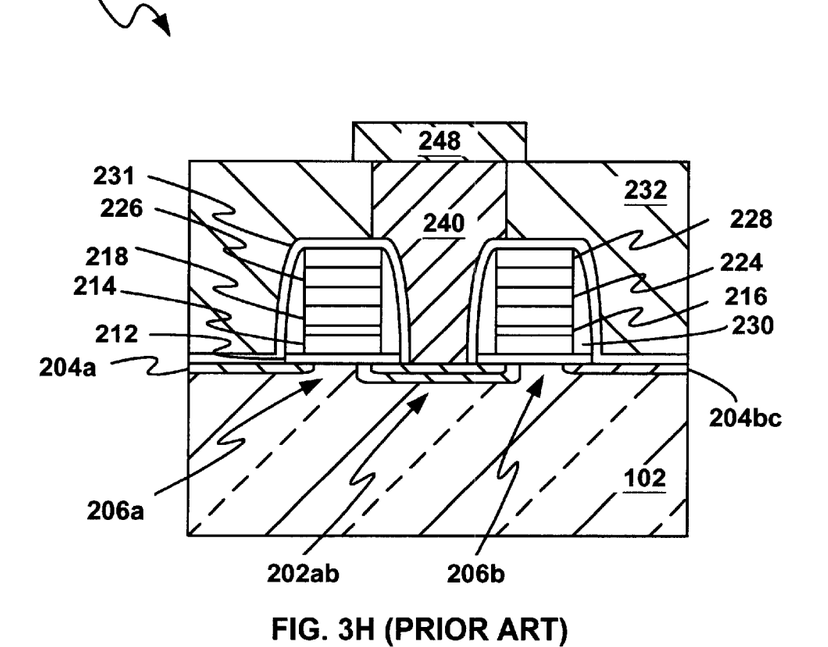

FIG. 3H (PRIOR ART) shows the removal of the interconnect mask 246.

Figure 3I:
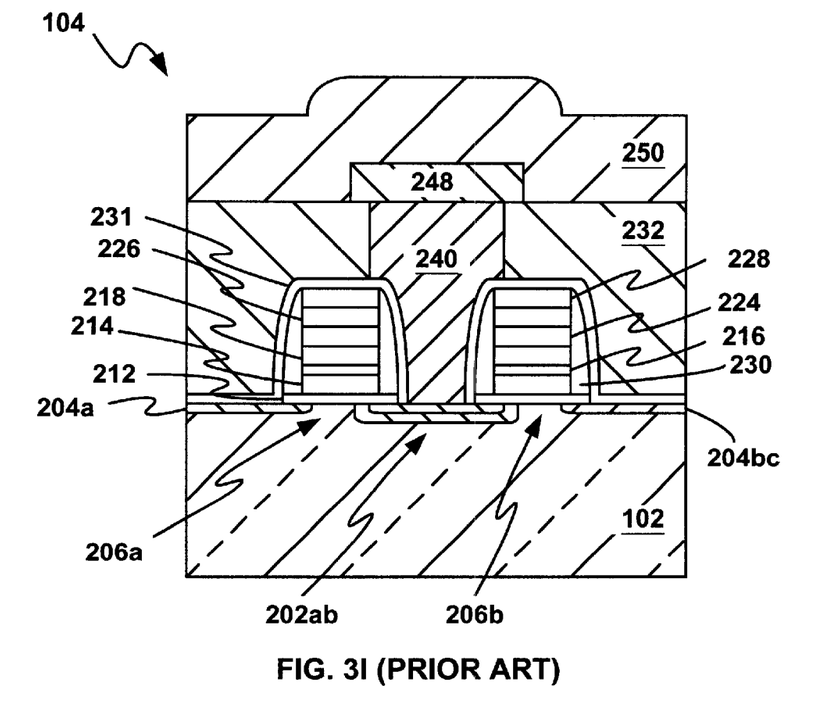
Figure 3J:
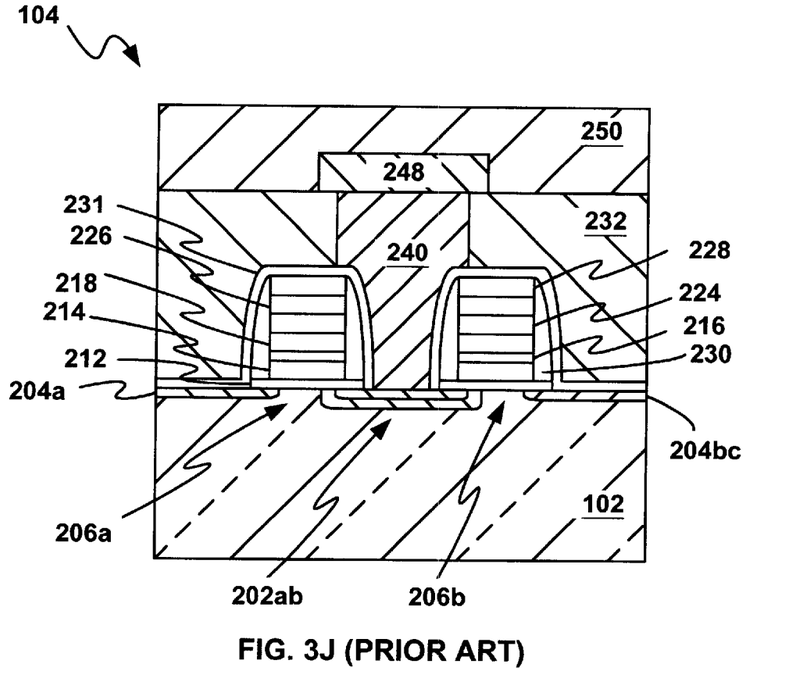

FIG. 3I (PRIOR ART) shows the deposition of a dielectric layer 250 over the dielectric layer 232, including over the interconnection line 248. The dielectric layer 250 is formed of a dielectric material and fills the spacing between adjacent interconnection lines (not shown).

FIG. 3J (PRIOR ART) shows the planarization of the dielectric material 250 above the interconnection line 248, using, for example, CMP.

As explained in the BACKGROUND ART, one of the problems associated with the conventional self-aligned contact process is that it requires two separate metallization steps and two planarization steps. Because each additional metallization or planarization step results in an increased cycle time, cost, and yield loss, there is a need to reduce the number of process steps in the formation of the self-aligned contacts.

Referring now to FIGS. 4A through 4G, therein is shown the sequence of process steps in accordance with the present invention for forming self-aligned contacts using a dual damascene technique. For convenience of illustration, like reference numerals are used in FIGS. 4A through 4G to denote like elements already described in FIGS. 1 (PRIOR ART), 2A (PRIOR ART) through 2D (PRIOR ART), and 3A (PRIOR ART) through 3J (PRIOR ART).

The present invention discloses the forming of self-aligned contacts and its associated interconnection lines using a dual damascene technique. Damascene is an art which has been employed for centuries in the fabrication of jewelry and has recently been adapted for application in the semiconductor industry. Damascene basically involves the formation of a trench or a channel opening that is filled with a metal to form a channel. The traditional etch back technique of providing an interconnection structure involves depositing a metal layer, forming a conductive pattern with interwiring spacings, and filling the interwiring spacings with dielectric material. Thus, damascene differs from the traditional etch back technique by forming a pattern of openings in a dielectric layer, which openings are filled in with metal to form a conductive pattern followed by planarization.

In a "dual damascene" technique, a first channel of conductive material and a second channel of conductive material below the first channel are positioned in vertically separate planes perpendicular to each other and interconnected by a vertical "via" at the closest point. The first channel opening and via are filled with metal at the same time, thereby reducing the number of metallization and planarization steps in the manufacturing process.

Figure 4A:
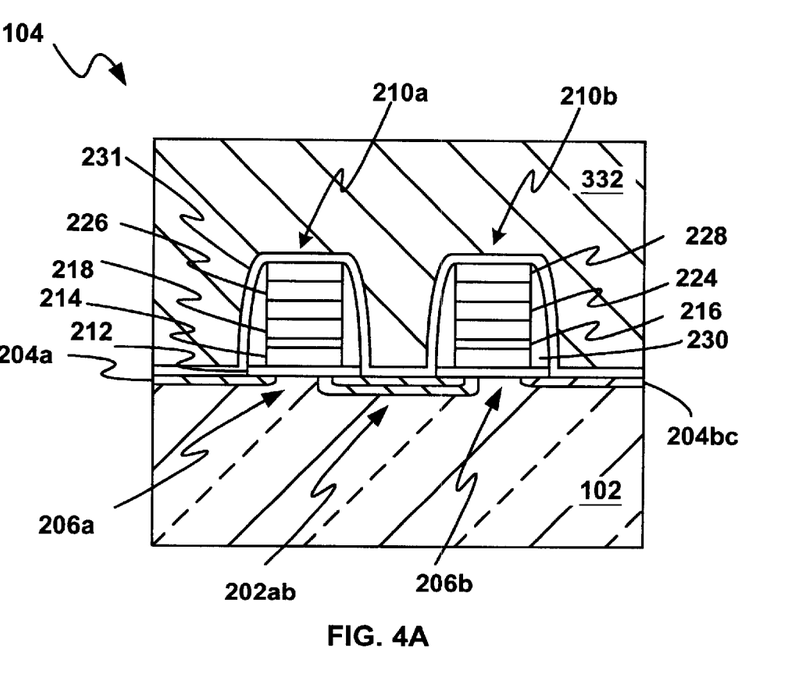

FIG. 4A shows a partial, sectional view of an intermediate state (partially complete) of a portion of a cell array core 104, similar to what was shown in FIG. 3B. At this stage is shown a pair of stacked gate structures 210a and 210b formed on a semiconductor substrate 102. A common source 202ab is formed between the two stacked gate structures 210a and 210b. Drains 204a and 204bc are formed on the semiconductor substrate 102 and are spaced apart from the common source 202ab by channel regions 206a and 206b, respectively. Sidewall spacers 230 are formed around the stacked gate structures 210a and 210b. The sidewall spacers 230 may be formed of an oxide or nitride material using conventional deposition and etching techniques. At this stage, except for the gate dielectric layer 212 that is located directly underneath the stack gates 210a and 210b and the sidewall spacers 230, the gate dielectric layer 212 in other areas of the substrate 102 has been removed. After the sidewall spacers 230 are formed, an etch stop layer 231 is formed over the entire substrate 102, including over the stacked gate structures 210a and 210b using conventional techniques, such as CVD. The etch stop layer 231 is typically formed of a nitride material such as silicon nitride. The deposition of the etch stop layer 231 is followed by the deposition of a dielectric layer 332 over the etch stop layer 231. The dielectric layer 332 has a thickness that is approximately equal to the length of a contact and the depth of an overlying channel opening that are yet to be formed. The dielectric layer 332 may include various oxides, such as boro-phospho-tetra-ethyl-ortho silicate (BPTEOS), formed using plasma enhanced chemical vapor deposition (PECVD). The etch stop layer 231 is used as an etch stop layer for the subsequent formation of contact openings in the dielectric layer 332.

In this embodiment, each of the stacked gate structures 210a (or 210b) includes a gate dielectric layer 212, a floating gate 214 disposed on the gate dielectric layer 212, an interpoly (inter-gate) dielectric layer 216 disposed on the floating gate 214, a control gate 218 overlying the interpoly dielectric 216, a silicide layer 224 disposed on the control gate 218, a polysilicon (poly cap) layer 226 disposed on the silicide layer 224, and a silicon oxynitride layer 228 disposed on the poly cap layer 226.

Figure 4B:
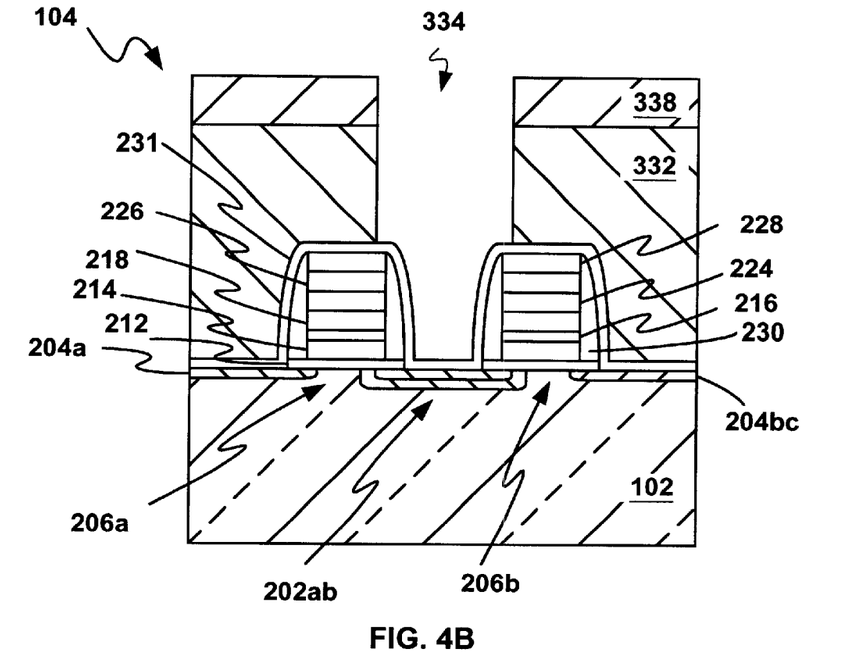

FIG. 4B shows the formation of a source/drain (S/D) contact opening 334 in the dielectric layer 332 using a contact mask 338. The contact opening 334 stops at the etch stop layer 231. For simplicity of illustration, only one contact opening 334 is shown. A conventional dielectric etch process is used to form the contact opening 334 which stops at the etch stop layer 231. The dielectric layer 332 may be etched with an etch process that has sufficiently high selectivity with respect to the etch stop layer 231; that is, the dielectric layer 332 can be etched with reactive ions at a rate significantly faster than the etch rate of the etch stop layer 231. The term "high selectivity" as used herein refers to a selectivity of more than about 8, which means the dielectric layer 332 can be etched with reactive ion more than about 8 times as rapidly as the etch stop layer 231.

Figure 4C:
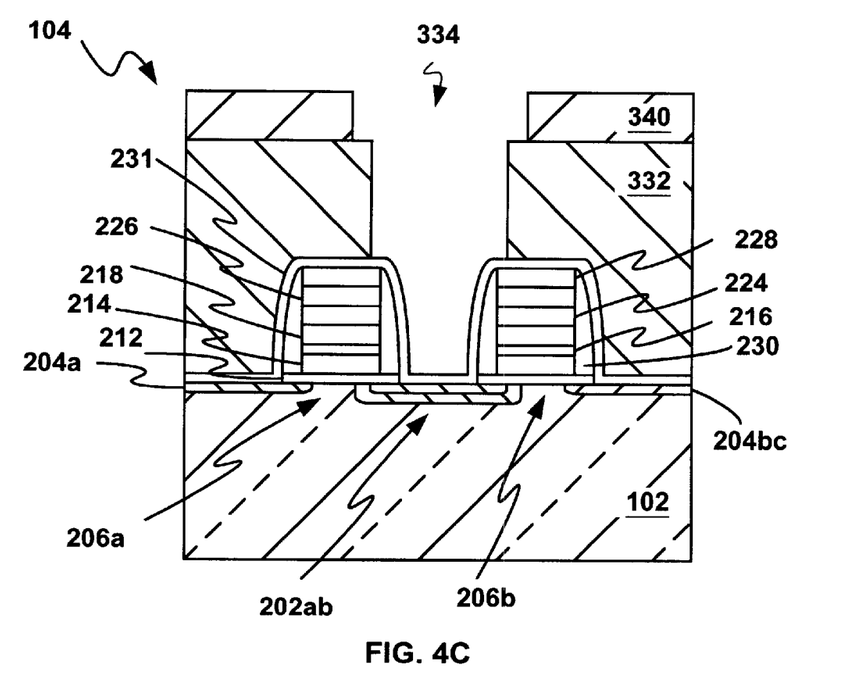

FIG. 4C shows the removal of the contact mask 338 and the formation of a trench mask 340 over the dielectric layer 332. The trench mask 340 is formed of a photoresist material.

Figure 4D:
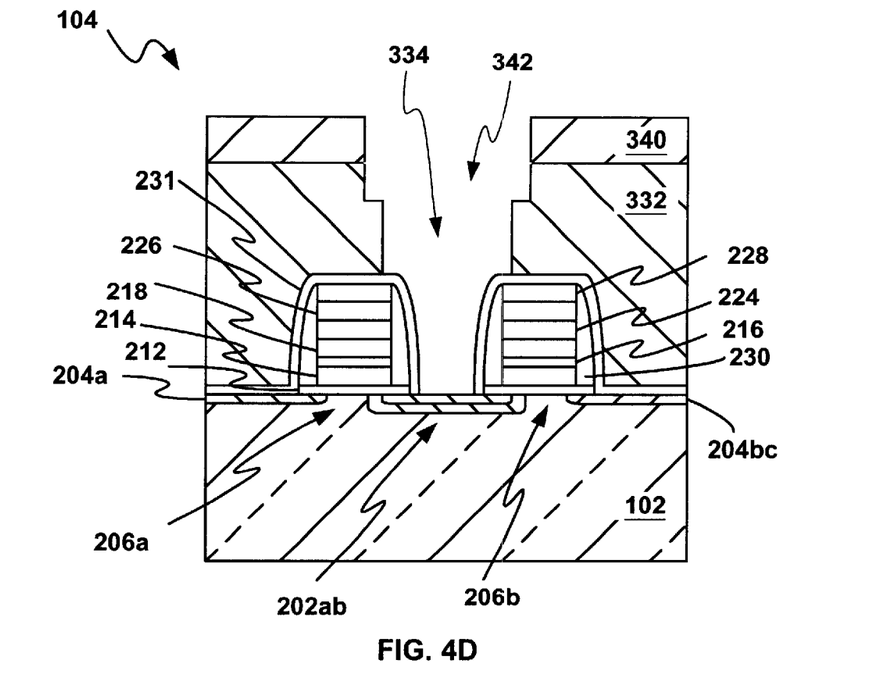

FIG. 4D shows the formation of a channel opening 342 in the dielectric layer 332 using a conventional dielectric etch process. To produce the desired depth for the channel opening 342, the dielectric etch process is stopped after a predetermined amount of time. The channel opening 342 encompasses the contact opening 334. After the formation of the channel opening 342, a conventional etch process is used to extend the contact opening 334 by removing portions of the etch stop layer 231 to expose portions of the common source 202ab adjacent to the sidewall spacers 230. Portions of the etch stop layer 231 around the sidewall spacers 230 may also removed during this etch process.

Figure 4E:
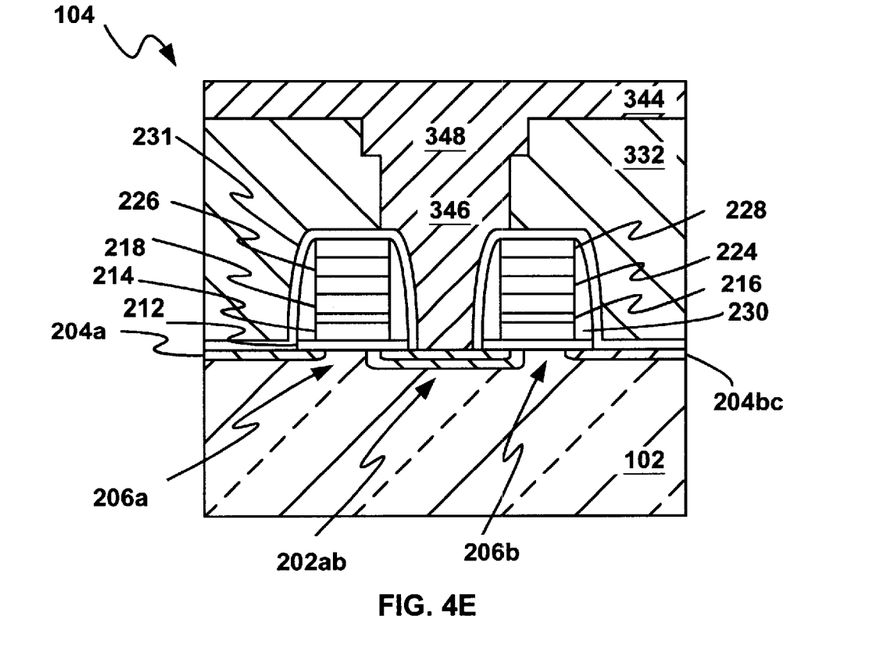

FIG. 4E shows the removal of the trench mask 340 and the deposition of a conductive material to form a conductive layer 344 over the dielectric layer 332. The conductive material fills the contact opening 334 and the channel opening 342 to form a contact 346 and a channel 348, respectively. The contact 346 is in electrical connection with the common source 202ab and the channel 348. The conductive material includes tungsten and may be formed using conventional metal deposition techniques, such as CVD and/or PVD. A barrier material (not shown), such as Ti/TiN, is typically deposited to coat the walls of the contact opening 334 and the channel opening 342 prior to the formation of the contact 346 and the channel 348 to ensure good adhesion and electrical contact of subsequent layers to the walls of the contact opening 334, the channel opening 342, and the underlying common source 202ab.

Figure 4F:
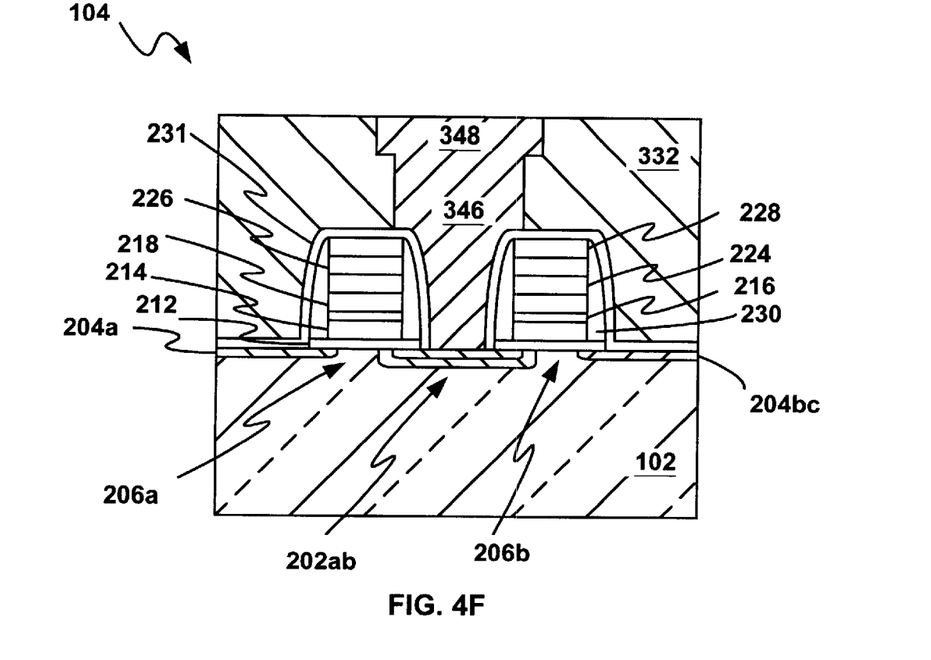

FIG. 4F shows the removal and planarization of the conductive material above the dielectric layer 332 using, for example, CMP. The conductive material is planarized until it is smooth with the top surface of the dielectric layer 332.

Figure 4G:
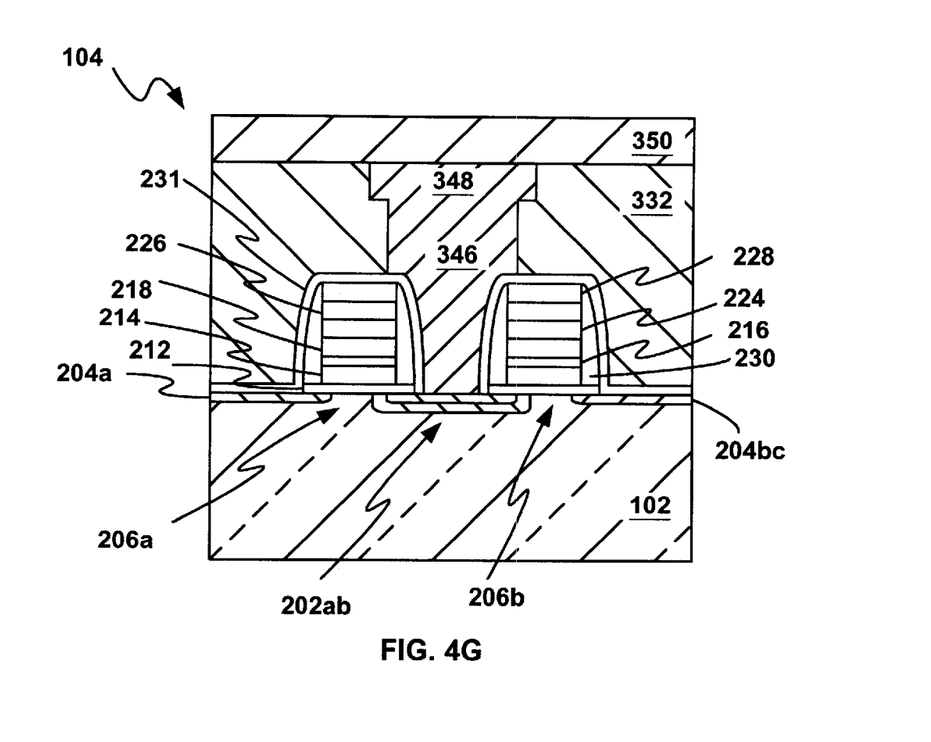

FIG. 4G shows the deposition of a further dielectric layer 350 over the dielectric layer 332. Since the dielectric layer is 332 has been planarized (FIG. 4F), the top surface of the dielectric layer 350 is planar because it replicates the topology of the underlying dielectric layer 332. Therefore, there is no need to planarize the dielectric layer 350. Accordingly, one planarization step is eliminated.

Therefore, by forming self-aligned contacts using the dual damascene technique in accordance with the present invention, the number of process steps is reduced. Unlike the conventional self-aligned contact process which requires two separate metallization steps and two planarization steps, the self-aligned contact process in the present invention requires only one metallization step and one planarization step because (1) the contact 346 and the channel 348 are formed at the same time, and (2) the dielectric layer 350 requires no further planarization as it replicates the topology of the planarized dielectric layer 332. Accordingly, the present invention advantageously reduces the number of process steps in the formation of self-aligned contacts which results in a reduction in cycle time, cost, and yield loss.

In production, a plurality of stacked gate structures is formed on a semiconductor substrate 102 using conventional techniques as shown in FIG. 4A. For simplicity of illustration, only two stacked gate structures, 210*a* and 210*b*, are shown. A common source 202*ab* is formed between the two stacked gate structures 210*a* and 210*b*. Drains 204*a* and 204*bc* are formed on the semiconductor substrate 102 and are spaced apart from the common source 202*ab* by channel regions 206*a* and 206*b*, respectively. Sidewall spacers 230 are formed around the stacked gate structures 210*a* and 210*b*. The sidewall spacers 230 are formed using conventional deposition and etching techniques. Except for the gate dielectric layer 212 that is located directly underneath the stack gates 210*a* and 210*b* and the sidewall spacers, the gate dielectric layer 212 in other areas of the substrate 102 is then removed. After the sidewall spacers 230 are formed, an etch stop layer 231 is formed over the entire substrate 102, including over the stacked gate structures 210*a* and 210*b* using conventional techniques, such as CVD.

In this embodiment, each of the stacked gate structures (210*a* or 210*b*) includes gate dielectric layer 212, a floating gate 214 disposed on the gate dielectric layer 212, an interpoly (inter-gate) dielectric layer 216 disposed on the floating gate 214, a control gate 218 overlying the interpoly dielectric 216, a silicide layer 224 disposed on the control gate 218, a polysilicon (poly cap) layer 226 disposed on the silicide layer 224, and a silicon oxynitride layer 228 disposed on the poly cap layer 226.

Next, a source/drain (S/D) contact opening 334 is formed in the dielectric layer 332 using a contact mask 338 (FIG. 4B). The contact opening 334 is formed using a conventional dielectric etch process which stops at the etch stop layer 231.

Thereafter, the contact mask 338 is removed and a trench mask 340 is formed over the dielectric layer 332 (FIG. 4C). The trench mask is formed using conventional technique, such as patterning and etching of a photoresist material.

After the formation of the trench mask 340, a channel opening 342 is formed using a conventional etch process (FIG. 4D). The channel opening 342 is formed to the desired depth by stopping the etch process after a predetermined amount of time. After the formation of the channel opening 342, a conventional etch process is used to remove portions of the etch stop layer 231 to expose portions of the common source 202*ab* adjacent to the sidewall spacers 230. Portions of the etch stop layer 231 around the sidewall spacers 230 may also removed during this etch process. The trench mask 340 is then removed.

A barrier material (not shown), such as Ti/TiN, is then deposited to coat the walls of the contact opening 334 and the channel opening 342 prior to the formation of a contact 346 and a channel 348 to ensure good adhesion and electrical contact of subsequent layers to the walls of the contact opening 334 and the channel opening 342, and the underlying common source 202*ab*.

Next, a conductive material is deposited to form a conductive layer 344 over the dielectric layer 332 using conventional metal deposition techniques, such as physical vapor deposition (PVD) and/or chemical vapor deposition (CVD) (FIG. 4E). The conductive material fills the contact opening 334 and the channel opening 342 to form a contact 346 and a channel 348, respectively. The conductive material includes tungsten.

After the formation of contact 346 and the channel 348, conductive material above the dielectric layer 332 is removed and planarized using for example, chemical-mechanical polishing (CMP), as shown in FIG. 4F.

Next, a further dielectric layer 350 is formed over the planarized dielectric layer 332. The dielectric layer includes an oxide or BPTEOS.

Therefore, the present invention provides a method for forming self-aligned contacts using the dual damascene technique which reduces the number of process steps. By forming the contact 346 and the channel 348 at the same time and forming the dielectric layer 350 on the planarized dielectric layer 332, the present invention eliminates one metallization and one planarization step and results in a reduction in cycle time, cost and yield loss.

While the best mode utilizes tungsten as the conductive material, it should be understood that the present invention is applicable to other materials selected from a group consisting of tantalum, titanium, copper, aluminum, gold, silver, alloys thereof, polysilicon, and compounds thereof.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A semiconductor device, comprising:
    a first multi-layer structure and a second multi-layer structure formed on an active region on the semiconductor substrate, said first multi-layer structure adjacent said second multi-layer structure;
    a first sidewall spacer formed around said first multi-layer structure;
    a second sidewall spacer formed around said second multi-layer structure;
    a dielectric layer formed over the semiconductor substrate, including said first multilayer structure, said first sidewall spacer, said second multi-layer structure, and said second sidewall spacer;
    a contact formed in said dielectric layer, said contact being in electrical connection with a portion of said region on the semiconductor substrate adjacent said first sidewall spacer and said second sidewall spacer, wherein said portion of said region is a source/drain region of the semiconductor device; and a channel formed in said dielectric layer atop said contact, said channel being in electrical connection with said contact.

2. The semiconductor device as claimed in claim 1 wherein said first multi-layer structure comprises a first dielectric layer, a first floating gate disposed on said first dielectric layer, a first inter-gate dielectric disposed on said first floating gate, and a first control gate disposed on said first inter-gate dielectric; and said second multi-layer structure comprises a second dielectric layer, a second floating gate disposed on said second dielectric layer, a second inter-gate dielectric disposed on said second floating gate, and a second control gate disposed on said second inter-gate dielectric.

3. The semiconductor device as claimed in claim 1 wherein said first multi-layer structure comprises a first etch stop layer disposed over said first control gate and said second multi-layer structure comprises a second etch stop layer disposed over said second control gate.

4. The semiconductor device as claimed in claim 1 including a further dielectric layer over said channel and said dielectric layer.

5. The semiconductor device as claimed in claim 1 wherein said contact and said channel are of a single conductive layer.

* * * * *